United States Patent
Hidalgo

(10) Patent No.: US 7,450,042 B2
(45) Date of Patent: Nov. 11, 2008

(54) MASS SPECTROMETER AND METHOD FOR COMPENSATING SAMPLING ERRORS

(75) Inventor: August Hidalgo, San Francisco, CA (US)

(73) Assignee: Agilent Technologies, Inc., Santa Clara, CA (US)

(*) Notice: Subject to any disclaimer, the term of this patent is extended or adjusted under 35 U.S.C. 154(b) by 0 days.

(21) Appl. No.: 11/412,563

(22) Filed: Apr. 27, 2006

(65) Prior Publication Data

US 2007/0252741 A1   Nov. 1, 2007

(51) Int. Cl.
*H03M 1/06* (2006.01)

(52) U.S. Cl. ...................... 341/118; 341/155

(58) Field of Classification Search .......... 341/118–155
See application file for complete search history.

(56) References Cited

U.S. PATENT DOCUMENTS

| | | | |
|---|---|---|---|
| 6,356,220 B1 * | 3/2002 | Takatsu | 341/137 |
| 6,433,713 B1 | 8/2002 | Fuhrman | |
| 6,653,626 B2 | 11/2003 | Fischer et al. | |
| 6,680,476 B1 * | 1/2004 | Hidalgo et al. | 250/286 |
| 6,744,044 B2 * | 6/2004 | Hidalgo et al. | 250/287 |
| 6,778,125 B1 | 8/2004 | Stewart et al. | |
| 6,822,227 B1 | 11/2004 | Hidalgo et al. | |
| 6,878,931 B1 | 4/2005 | Roushall et al. | |
| 2003/0173514 A1 | 9/2003 | Syage et al. | |
| 2003/0218129 A1 | 11/2003 | Rather | |
| 2007/0114379 A1 * | 5/2007 | Roushall et al. | 250/284 |

* cited by examiner

*Primary Examiner*—Lam T Mai

(57) ABSTRACT

A mass spectrometer system includes an ion detector, a plurality of analog-to-digital (A/D) converters, an adder, and a controller. The A/D converters are configured to sample an analog signal from the ion detector at different times, and the A/D converters introduce sampling errors to digital samples generated by the A/D converters. The adder is configured to sum the digital samples, and the summed digital samples define a mass spectrum. The controller is configured to compensate for the sampling errors introduced by the A/D converters.

24 Claims, 6 Drawing Sheets

| Address | Value |
|---|---|
| 0000 | $SAMPLE_0$ |
| 0001 | $SAMPLE_1$ |
| 0002 | $SAMPLE_2$ |
| 0003 | $SAMPLE_3$ |
| 0004 | $SAMPLE_4$ |
| 0005 | $SAMPLE_5$ |
| 0006 | $SAMPLE_6$ |
| 0007 | $SAMPLE_7$ |

| Address | Value |
|---|---|
| 0000 | xxxxxxxx |
| 0001 | xxxxxxxx |
| 0002 | xxxxxxxx |
| 0003 | xxxxxxxx |
| 0004 | $SAMPLE_0'$ |
| 0005 | $SAMPLE_1'$ |
| 0006 | $SAMPLE_2'$ |
| 0007 | $SAMPLE_3'$ |
| 0008 | $SAMPLE_4'$ |
| 0009 | $SAMPLE_5'$ |
| 000A | $SAMPLE_6'$ |
| 000B | $SAMPLE_7'$ |

MASS SPECTROMETER AND METHOD FOR COMPENSATING SAMPLING ERRORS

RELATED ART

In time-of-flight mass spectrometers (TOFMS), a mass sample to be analyzed is ionized, accelerated in a vacuum through a known potential, and then the arrival time of the different ionized components is measured at a detector. The larger the particle, the longer the flight time; the relationship between the flight time and the mass, m, can be written in the form:

$$\text{time} = k\sqrt{m} + c$$

where k is a constant related to flight path and ion energy, c is a small delay time, which may be introduced by the signal cable and/or detection electronics.

An ion detector converts ion impacts into electrons. The signal generated by the detector at any given time is proportional to the number of electrons. There is only a statistical correlation between one ion hitting the detector and the number of electrons generated. In addition, more than one ion at a time may hit the detector due to ion abundance.

The mass spectrum generated by the spectrometer is the summed output of the detector as a function of the time-of-flight between the ion source and the detector. The number of electrons leaving the detector in a given time interval is converted to a voltage that is digitized by an analog-to-digital converter (A/D).

A mass spectrum is a graph of the output of the detector as a function of the time taken by the ions to reach the detector. In general, a short pulse of ions from an ion source is accelerated through a known voltage. Upon leaving the accelerator, the ions are bunched together but travelling at different speeds. The time required for each ion to reach the detector depends on its speed, which in turn, depends on its mass.

A mass spectrum is generated by measuring the output of the A/D converter as a function of the time after the ions have been accelerated. The range of delay times is divided into discrete "bins." Unfortunately, the statistical accuracy obtained from the ions that are available in a single such pulse is insufficient. In addition, there are a number of sources of noise in the system that result in detector output even in the absence of an ion striking the detector. Hence, the mass scan is repeated a number of times, and the individual mass spectra are summed to provide a final result having the desired statistical accuracy and signal-to-noise ratio.

To improve the accuracy and performance of mass spectrometers, great efforts have been expended to increase resolution and reduce distortion. Further improvements to the accuracy and performance of mass spectrometers are generally desirable.

SUMMARY OF THE DISCLOSURE

Generally, embodiments of the present disclosure provide mass spectrometers and methods for compensating sampling errors, such as offset and gain errors, introduced by parallel analog-to-digital converters.

A mass spectrometer system in accordance with one embodiment of the present disclosure comprises an ion detector, a plurality of analog-to-digital (A/D) converters, an adder, and a controller. The A/D converters are configured to sample an analog signal from the ion detector at different times, and the A/D converters introduce sampling errors to digital samples generated by the A/D converters. The adder is configured to sum the digital samples, and the summed digital samples define a mass spectrum. The controller is configured to compensate for the sampling errors introduced by the A/D converters.

A method in accordance with one embodiment of the present disclosure comprises: receiving an analog signal indicative of detected ion abundance; sampling the analog signal via a plurality of analog-to-digital (A/D) converters to provide a plurality of digital samples, the sampling introducing sampling errors to the digital samples; summing the digital samples; and compensating for the sampling errors introduced by the digital samples.

BRIEF DESCRIPTION OF THE DRAWINGS

The disclosure can be better understood with reference to the following drawings. The elements of the drawings are not necessarily to scale relative to each other, emphasis instead being placed upon clearly illustrating the principles of the disclosure. Furthermore, like reference numerals designate corresponding parts throughout the several views.

FIG. 3 is a diagram illustrating exemplary values stored in memory as the mass spectrometer of FIG. 2 is performing a measurement of a mass sample.

FIG. 5 is a diagram illustrating exemplary values stored in memory as the mass spectrometer of FIG. 4 is performing a measurement of a mass sample.

DETAILED DESCRIPTION

The present disclosure generally relates to mass spectrometers and methods that employ multiple analog-to-digital (A/D) converters to sample analog signals indicative of detected ion abundance. A mass spectrometer in accordance with one embodiment of the present disclosure has a plurality of A/D converters that are configured to sample, in parallel, an analog output of an ion detector. The samples of several mass scans are summed in order to achieve a desired statistical accuracy of the mass spectrum define by the summed samples.

To compensate for sampling errors, such as errors in offset and gain between synchronized A/D converters, a controller of the mass spectrometer is configured to ensure that corresponding samples from different scans are sampled by different A/D converters yet are properly summed together to provide an accurate summed sample of the resulting mass spectrum. As used herein, samples are "corresponding" if they are taken at the same time after the start of different mass scans. For example, if a sample is taken at a time $t_0$ after the start of a first mass scan, then the corresponding sample of a second mass scan is taken at approximately the same time $t_0$ after the start of the second mass scan.

Moreover, by utilizing multiple A/D converters for the corresponding samples, it is likely that error in the offset and gain from at least one A/D converter will cancel or compensate for the error in the offset and gain from at least one other A/D converter. Thus, the error in the final summed sample that represents a sum of the corresponding samples from the different A/D converters is likely to be much lower as compared to an embodiment that uses the same A/D converter to sum the corresponding samples.

Figure 1:
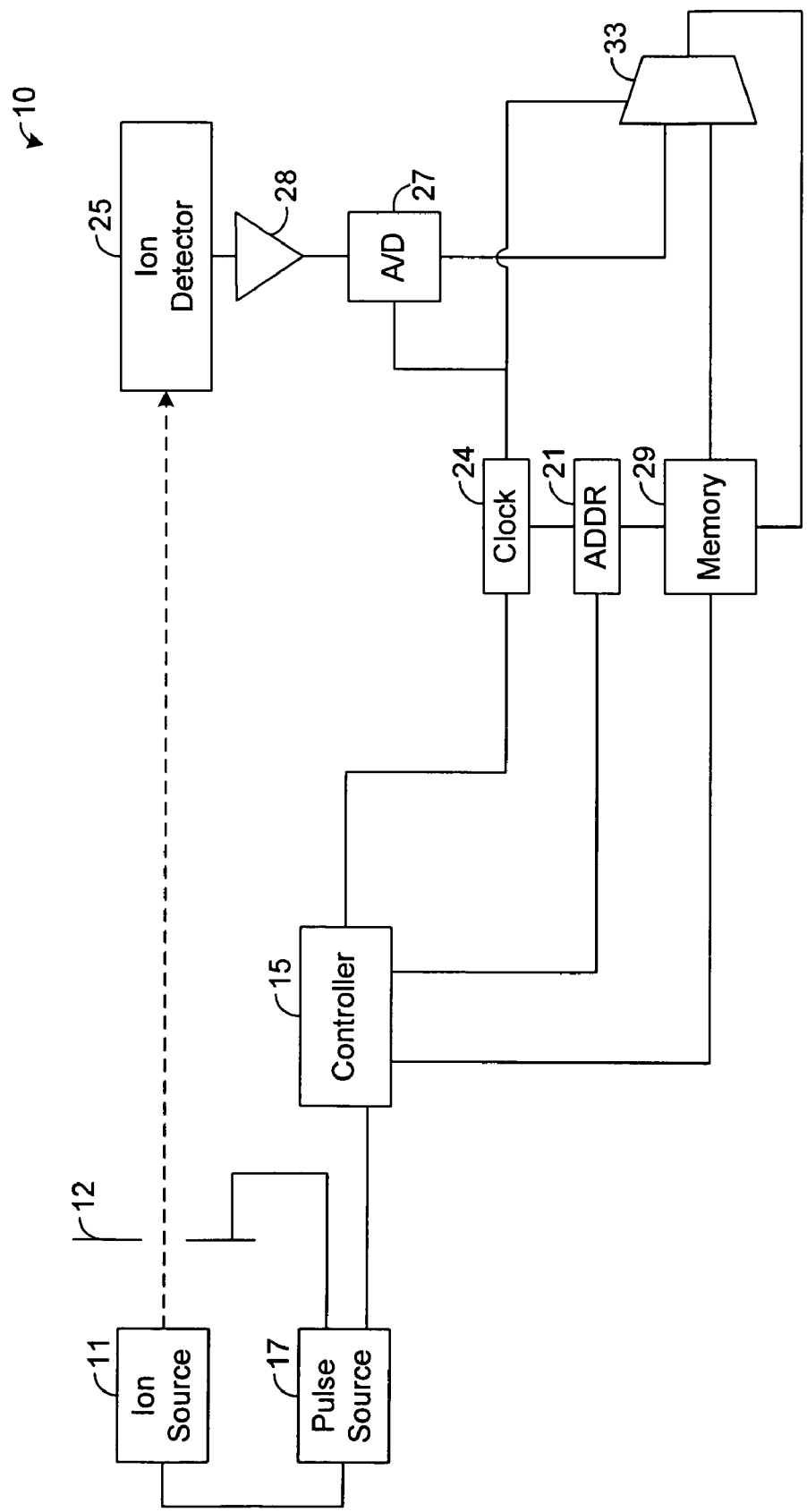
FIG. 1 is a block diagram illustrating a conventional time of flight mass spectrometer.

FIG. 1 illustrates a conventional time-of-flight mass spectrometer 10. A mass sample to be analyzed is introduced into an ion source 11 that ionizes the sample. The ions so produced are accelerated by applying a potential between the ion source 11 and an electrode 12. At the beginning of each mass scan, a controller 15 causes a short pulse to be applied between the electrode 12 and ion source 11 by sending the appropriate control signal to a pulse source 17. The controller 15 also sets the contents of a write address register 21 to a predefined initial value. On subsequent clock cycles, the address register 21 is incremented by a signal from a clock 24, and an analog signal generated by an ion detector 25 is digitized by an analog-to-digital converter (A/D) 27 after being amplified by an amplifier 28. The value stored in memory 29 at the address specified in the address register 21 is applied to an adder 33, which adds the stored value to the value provided by A/D converter 27. The summed value is then stored back in memory 29 at the address in question.

As noted above, the time required by an ion to traverse the distance between the electrode 12 and the detector 25 is a measure of the mass of the ion. This time is proportional to the value in address register 21 when the ion strikes the detector 25. Hence, memory 29 stores data that can be used to generate a graph of the number of ions with a given mass as a function of the mass. In other words, the data stored in memory 29 defines a mass spectrum of the mass sample being analyzed.

Various devices, such as a Faraday cup or a Daly detector, for example, may be used to implement the ion detector 25. The signal generated by the ion detector 25 depends on the number of ions striking the detector 25 during the clock cycle in question. In general, this number is relatively small, and hence the statistical accuracy of the measurements obtained in any single mass scan is usually insufficient. In addition, there is a significant amount of noise in the system. The noise is generated both in the detector 25, analog path, and in the A/D converter 27.

To improve statistical accuracy, the data from a large number of mass scans are summed. At the beginning of the measurement process, the controller 15 stores zeros in all of the memory locations in memory 29 to be used for the mass scans and initiates the first mass scan. When the first mass scan is completed, the controller 15 resets the address register 21 to the predefined initial value described above and initiates another mass scan by pulsing the electrode 12. The data from the second mass scan is added to that from the previous mass scan. This process is repeated until the desired statistical accuracy is obtained.

Figure 2:
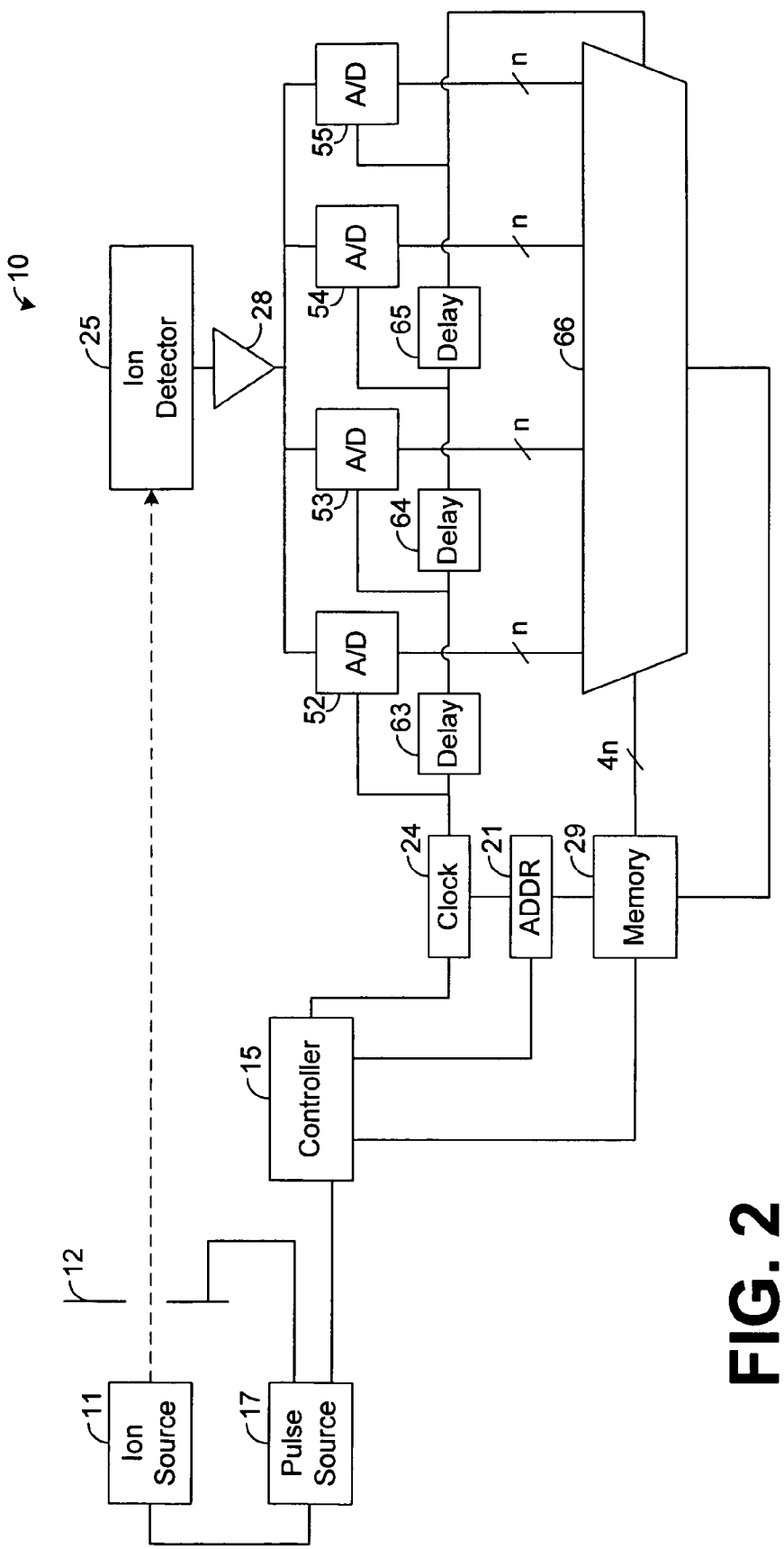
FIG. 2 is a block diagram illustrating a conventional time of flight mass spectrometer employing a plurality of A/D converters for increasing a sampling rate of the mass spectrometer.

To enable a greater sampling rate of the ion detector output and, therefore, a greater resolution, a plurality of A/D converters 52-55 may be used, as shown by FIG. 2. For illustrative purposes, FIG. 2 depicts four A/D converters 52-55, although any number of A/D converters may be used.

The clock signals provided to the A/D converters 52-55 are offset such that each A/D converter 52-55 is triggered to take a sample at different times with respect to the other A/D converters 52-55. In this regard, a clock signal from clock 24 is delayed by delay circuits 63-65. In one embodiment, each delay circuit 63-65 delays its respective clock signal by the same amount. For example, assume that each A/D converter 52-55 is configured to take a sample in response to each rising edge of its respective clock signal. In such an embodiment, the delay introduced by each delay circuit 63-65 is ideally (1/x) of a clock cycle, where x is the total number of A/D converters 52-55 sampling the output of the ion detector 25. For example, in the embodiment shown by FIG. 2, the A/D converter 53 captures a sample one-quarter of a clock cycle after the A/D converter 52 captures a sample. Further, A/D converter 54 captures a sample one-half of a clock cycle after A/D converter 52 captures a sample, and A/D converter 55 captures a sample three-quarters of a clock cycle after A/D converter 52 captures a sample.

An adder 66 sums the samples output by the A/D converters 52-55 with values previously stored in memory 29 to appropriately define the mass spectrum. If the output of each A/D converter 52-55 is n bits, then the memory 29 provides an input having xn bits to the adder 66, where x is the total number of A/D converters 52-55. For example, in the embodiment depicted by FIG. 2, the memory 29 provides 4n bits to the adder 66 for each clock cycle. In this regard, if each memory address stores an n bit value, then the value previously stored at the address, referred to as "address$_1$," indicated by the address register 21 is added to the output of A/D converter 52, and the result is stored back to this address (i.e., address$_1$). Further, the value stored at the next memory address (address$_2$=address$_1$+1), is added to the output of A/D converter 53, and this result is stored at this address (i.e., address$_2$). In addition, the value stored at the next memory address (address$_3$=address$_1$+2) is added to the output of A/D converter 54, and the result is stored back to this address (i.e., address$_3$). Also, the value stored at the next memory address (address$_4$=address$_1$+3) is added to the output of A/D converter 55, and this result is stored at this address (i.e., address$_4$). At the end of such a cycle, the value in the address register 21 has been incremented by a value of x since the beginning of the cycle so that the next sample occurring for the next clock cycle is stored to a new address (address$_5$=address$_1$+4).

To better illustrate the summing process, assume that the memory addresses of memory 29 are four digit hexagonal values and that the controller 15 sets the address register 21 to an initial value of 0000. The memory 29 for such an embodiment is shown by FIG. 3.

Initially, the values of addresses 0000-0007 are set to zero. As mass scans are performed, samples from the A/D converters 52-55 are added to the values in these addresses 0000-0007 and the results are stored back to these addresses. Moreover, each value in the addresses 0000-0007 represents a running sum of corresponding samples. For example, SAMPLE$_0$ represents a running sum of all of the samples taken approximately at a time $t_0$ after the beginning of each mass scan, and SAMPLE$_1$ represents a running sum of all of the samples taken approximately at a time $t_1$ after the beginning of each mass scan. The other samples in addresses 0002-0007 similarly represent running sums of samples for different time periods after the start of each mass scan.

Shortly after the start of the first mass scan, the A/D converter 52 samples the output of ion detector 25, and this sample is added to the value at address 0000. The result of this sum operation is stored at address 0000. One-quarter of a clock cycle later, the A/D converter 53 samples the output of ion detector 25, and this sample is added to the value at address 0001. The result is stored at this same address 0001. One-quarter of a clock cycle later, the A/D converter 54 samples the output of ion detector 25, and this sample is added to the value at address 0002. The result is stored at this same address 0002. One-quarter of a clock cycle later, the A/D converter 55 samples the output of ion detector 25, and this sample is added to the value at address 0003. The result is stored at this same address 0003.

At the end of the foregoing clock cycle, the controller 15 increments the address register 21 such that it identifies address 0004. Thus, on the next cycle, samples from A/D converters 52-55 are respectively summed with the values in addresses 0004-0007. Additional samples for other clock cycles can be similarly summed with values in other memory addresses.

At the end of the first mass scan, a second mass scan is initiated. Samples are taken and summed with the values in memory 29 according to the methodology described above. Thus, the first sample taken after the start of the second mass scan is summed with the value at address 0000 just as was done for the first sample taken after the start of the first scan. Further, these samples are taken at the same time $t_0$ after the start of their respective mass scans.

The other samples for the second mass scan are similarly summed with their corresponding summed samples stored in memory 29. For example, a second sample is taken during the second mass scan approximately one-quarter of a clock cycle after the first sample and is summed with the summed sample previously stored at address 0001. A third sample is taken approximately one-quarter of a clock cycle later and summed with the summed sample previously stored at address 0002. In addition, a fourth sample is taken approximately one-quarter of a clock cycle later and summed with the summed sample previously stored at address 0003.

Moreover, the samples summed together to form a value in memory 29 are generated by the same A/D converter 52-55. For example, the samples summed to define the value at address 0000 are generated by the A/D converter 52. Similarly, the samples summed to define the value at address 0001 are generated by the A/D converter 53, and the samples summed to define the value address 0002 are generated by the A/D converter 54. In addition, the samples summed to define the value at address 0003 are generated by the A/D converter 55. Similarly, the samples summed to define values at addresses 0004-0007 are respectively generated by A/D converters 52-55.

It is likely that different A/D converters have different errors in offset and gain. Since the mass spectrometer 10 is synchronous and, in particular, since the A/D converters 52-55 are synchronized with one another, the errors in offset and gain will show as pattern errors repeated each time a mass scan is performed. Thus, the errors accumulate as the samples are summed for multiple mass scans. Indeed, due to the extremely large number of mass scans performed by a mass spectrometer (e.g., hundreds to thousands), the accumulation of errors in offset and gain can significantly distort the resulting mass spectrum.

Figure 4:
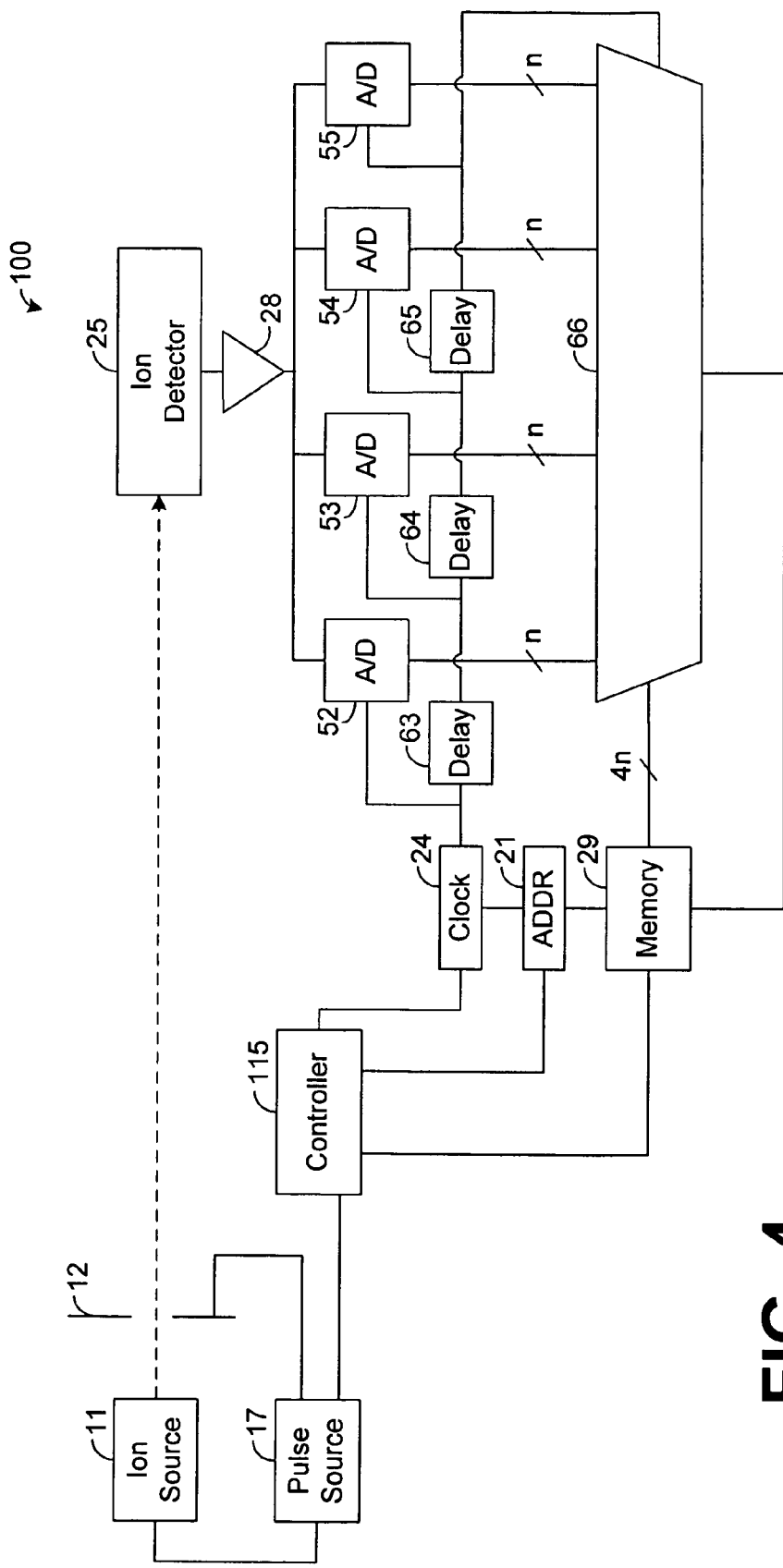
FIG. 4 is a block diagram illustrating a time of flight mass spectrometer in accordance with an exemplary embodiment of the present disclosure.

FIG. 4 depicts a time-of-flight mass spectrometer 100 in accordance with an exemplary embodiment of the present disclosure. To simplify the description of FIG. 4 and subsequent drawings, those elements that serve functions analogous to elements discussed above with reference to FIGS. 1 and 2 have been given the same numeric designations.

As shown by FIG. 4, the mass spectrometer 100 comprises an ion source 11, a pulse source 17, a write address register 21, a clock 24, an ion detector 25, an amplifier 28, memory 29, an adder 66, and A/D converters 52-55. Except as otherwise described herein, these elements, operating under the direction and control of a controller 115, perform essentially the respective functions as the elements of the same reference numerals in FIG. 2. Note that the controller 115 may be implemented in hardware, software, or a combination thereof. As an example, the controller 115 may be implemented in software and executed by a digital signal processor (DSP), a central processing unit (CPU), or other type of apparatus for executing the instructions of the controller 115. In other embodiments, the controller 115 can be implemented in firmware or hardware, such as logic gates, for example.

Moreover, as described above with reference to FIG. 2, a mass sample to be analyzed is introduced into the ion source 11 that ionizes the mass sample. A pulse from the pulse source 17 causes the ions in the ion source 11 to be accelerated toward the ion detector 25, which detects the accelerated ions. The ion detector 25 outputs an analog signal indicative of the detected ions.

As in FIG. 2, the analog signal output by the detector 25 of FIG. 2 is amplified by the amplifier 28 and is sampled by the A/D converters 52-55. The samples from the A/D converters 52-55 are summed by adder 66, and running sums of such samples are stored in memory 29. In this regard, as in the embodiment of FIG. 2, each memory address in memory 29 used for defining the resulting mass spectrum is storing a running sum of corresponding samples from the A/D converters 52-55.

Thus, once the spectrometer 50 takes a measurement, which preferably includes a large number of mass scans, the memory 29 is storing measurement data similar to the embodiment depicted by FIG. 2. Such measurement data defines a mass spectrum of the ionized sample.

As described above, each sample in the memory 29 represents a running sum of corresponding samples from the A/D converters 52-55, similar to the summed samples in memory 29 of FIG. 2. However, instead of having the same A/D converter generate all of the samples that are added together for the same memory address, the controller 115 is configured to ensure that at least some of the samples added together for the same memory address are generated by different A/D converters 52-55. Thus, random differences in the errors in offset and gain between the different A/D converters 52-55 will likely compensate for and reduce the effect of such errors. In this regard, errors in offset and gain from one A/D converter 52-55 for one set of samples are likely different than errors in offset and gain from another A/D converter 52-55. Thus, when samples from such different A/D converters 52-55 are summed, there is a chance that errors introduced by one A/D converter 52-55 will counteract the errors introduced by the other A/D converter 52-55. Generally, increasing the number of A/D converters 52-55 used to generate the samples that are summed together tends to increase the probability that errors in offset and gain will be reduced.

There are various methodologies that may be employed to ensure that each summed sample in memory 29 is based on corresponding samples from different A/D converters 52-55. Exemplary techniques for achieving the foregoing will be described in more detail below. However, one of ordinary skill in the art upon reading this disclosure will appreciate that other techniques may be employed in other embodiments.

Initially, the controller 115 controls the other components of the mass spectrometer 100 of FIG. 4 similar to the way that the conventional controller 15 controls the mass spectrometer 10 of FIG. 2. In this regard, the controller 115 initializes all of the addresses in memory 29 to a value of zero, but the controller 115 uses addresses 0004-000B to store the first eight summed samples (i.e., $SAMPLE_0'$ through $SAMPLE_7'$) defining the mass spectrum. Thus, after performing several mass scans of the ionized mass sample, the memory 29 is storing summed samples in addresses 0004-000B, as shown by FIG. 5. Note that the "x's" in addresses 0000-0003 indicate that the values at these addresses do not define a sample point of the mass spectrum.

Moreover, as described above, $SAMPLE_0'$ at address 0004 is a running sum of corresponding samples from A/D converter 52. Similarly, $SAMPLE_1'$, $SAMPLE_2'$, and $SAMPLE_3'$ are running sums of corresponding samples from A/D converters 53-55, respectively, just as is described above with reference to FIGS. 2 and 3. In addition, $SAMPLE_4'$ through $SAMPLE_7'$ are running sums of corresponding samples from A/D converters 52-55, respectively.

After a specified number of mass scans, the controller 115 adjusts the timing of the pulse generated by pulse source 17 with respect to the clock signal used to clock the A/D converters 52-55. In particular, the controller 115 adjusts this timing relationship such that each A/D converter 52-55 samples the output of the ion detector 25 at different time periods for the next mass scan as compared to the previous scans. The controller 115 then adjusts the value in address register 21 such that the samples for this next mass scan, as well as future scans, are appropriately summed. In this regard, the controller 115 ensures that only corresponding samples are summed together. Thus, if $SAMPLE_0'$ represents a running sum of samples taken at a time $t_0$ after the start of each of the previous mass scans, then the controller 115 ensures that the sample taken at time $t_0$ after the start of the next mass scan is added to $SAMPLE_0'$.

To achieve the foregoing in one embodiment, the controller 115, after completion of the specified number of mass scans, is configured to delay the pulse generated by the pulse source 17 by $(1/x)$ of a clock cycle, where x represents the total number of A/D converters 52-55. In addition, before initiating the next mass scan, the controller 115 resets the value in address register 21 to its predefined initial value (i.e., 0004 in the instant example), as it does in the aforedescribed embodiments. However, the controller 115 then decrements this value by 1. Thus, the address register 21 is pointing to memory address 0003 in memory 29. Further, after adjusting the timing of the pulse and the value of address register 21, as described above, the controller 115 controls the components of the spectrometer 100 for the next mass scan as previously described above for the previous mass scans. As a result, each A/D converter 52-55 samples one-quarter of a clock cycle earlier in the next mass scan as compared to the previous mass scans. Note that the current mass scan starts upon generation of the pulse from the pulse source 17. Thus, in the instant example, the controller 115, by delaying generation of the pulse from pulse source 17 by one-quarter of a clock cycle, effectively delays the start of the current mass scan by one-quarter of a clock cycle.

Therefore, the first sample generated by the A/D converter 52 after completion of the specified number of mass scans does not correspond to any of the samples currently stored in memory 29. For example, if $SAMPLE_0'$ is based on samples taken at time $t_0$ after the start of the previous scans, then the first sample of the current mass scan is generated one-quarter of a clock cycle prior to. Since the address register 21 is pointing to memory address 0003, the adder 66 adds the value at memory address 0003 to the first sample from A/D converter 52, and this result is stored to address 0003. Then, one-quarter of a clock cycle later (i.e., at time $t_0$ after the start of the current mass scan), the A/D converter 53 takes a sample, which corresponds to $SAMPLE_0'$ stored at address 0004.

Moreover, the adder 66 adds the foregoing sample from A/D converter 53 with $SAMPLE_0'$, and stores the result, which represents the new $SAMPLE_0'$, at address 0004. Thus, by delaying the start of the current mass scan and appropriately updating the address register 21 to account for this delay, the controller 115 has changed which of the A/D converters 52-55 provides the samples to be added to $SAMPLE_0'$. In particular, as illustrated by the previous example, the A/D converter 53 provides the sample to be added to $SAMPLE_0'$ in the current mass scan whereas the samples from A/D converter 52 were summed to define $SAMPLE_0'$ in the previous mass scans.

Similarly, the A/D converters that provide samples for the other summed samples in memory 29 have also changed. For example, the sample to be added to $SAMPLE_1'$ is provided by A/D converter 54, and the sample to be added to $SAMPLE_2'$ is provided by A/D converter 55. Additionally, the sample to be added to $SAMPLE_3$ is provided by A/D converter 52. The controller 115 continues to delay the start of future mass scans as described above, but the amount of delay may be periodically adjusted, as will be described in more detail below.

To increase the randomness of the summed errors, the controller 115 periodically adjusts the delay applied to mass scan starts such that all of the A/D converters 52-55 contribute equally to each of the summed samples that define the resulting mass spectrum. For example, if 10,000 mass scans are to be performed to define a mass spectrum of the ionized mass sample, then the first mass scan delay could occur after mass scan number 2,500. This same delay may be applied to each mass scan start thereafter until 5,000 total mass scans have been performed. After mass scan number 5,000, the delay applied to the mass scan starts may be adjusted to one-half of a clock cycle instead of one-quarter of a clock cycle. After mass scan number 7,500, the delay may be again adjusted to three-quarters of a clock cycle. In such an example, each A/D converter 52-55 contributes the same number of samples (i.e., 2,500) to the same running sum representing a single sample point of the resulting mass spectrum.

However, each time that the delay is adjusted, the amount that the controller 115 decrements the address the address register 21 is increased by one to appropriately account for the effect of the delays to the summing process. For example, upon the second adjustment to the delay of the pulse (after mass scan number 5,000 in the above example), the controller 115 resets the value in address register to 0004 and then decrements this value by 2. Thus, the address register 21 is pointing to 0002 at the start of the next mass scan (i.e., scan number 5,001). In such an example, the first summed samples generated by A/D converters 52 and 53 do not correspond to any of the samples in address 0004 and higher, and these first samples are added to the values stored in addresses 0002 and 0003, respectively. Upon the third delay of the pulse (after mass scan number 7,500 in the above example), the controller 115 resets the value in address register to 0004 and then decrements this value by 3.

An exemplary operation of the mass spectrometer 100 will be described in more detail hereafter with particular reference to FIG. 6.

For illustrative purposes, assume that the configuration of the mass spectrometer 100 is identical to that shown by FIG. 4 with four A/D converters 52-55. Further, assume that mass spectrometer 100 is to perform 10,000 mass scans of a mass sample to generate a mass spectrum for this mass sample.

Figure 6:
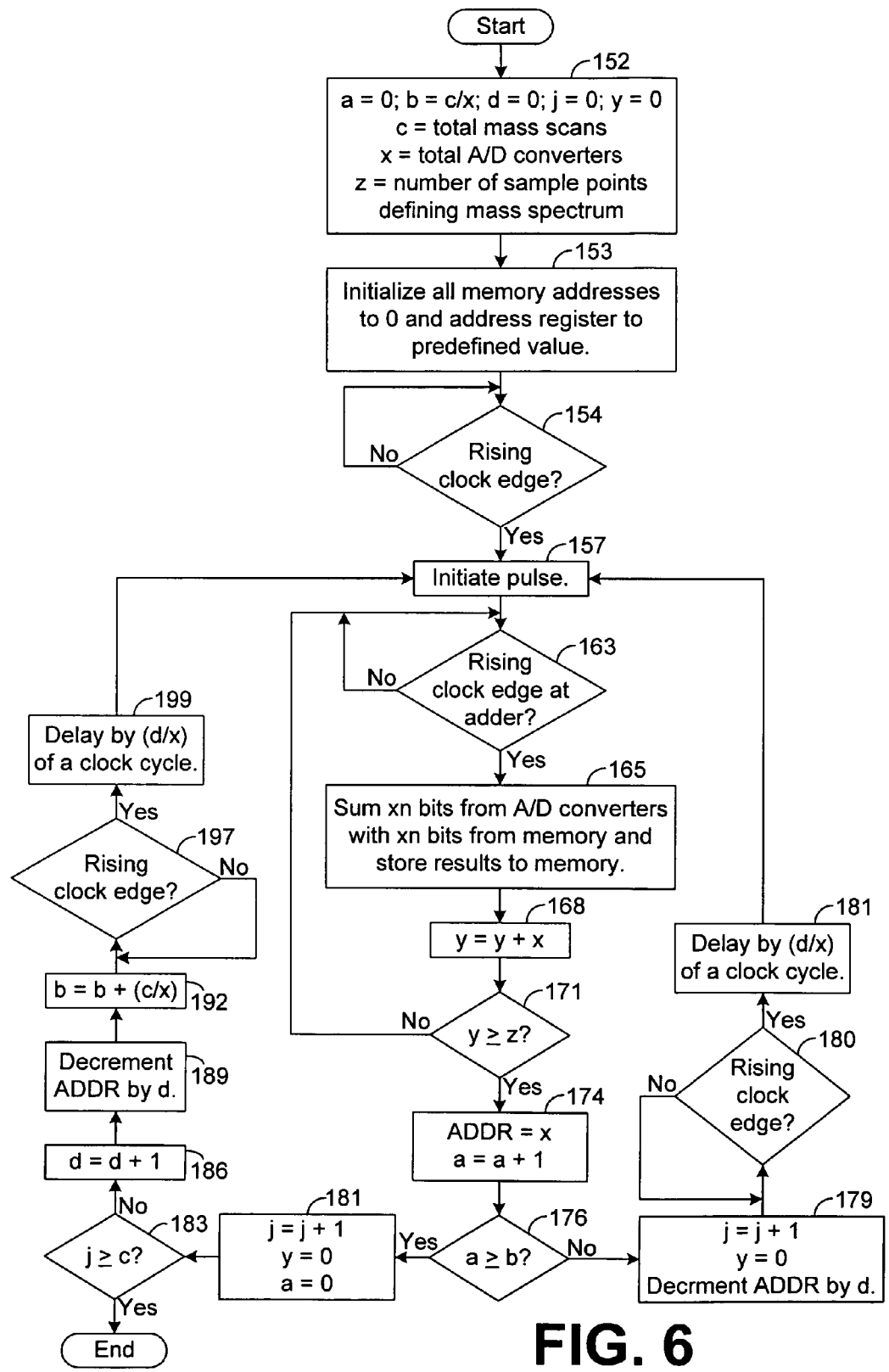
FIG. 6 is a flow chart illustrating an exemplary methodology for performing a measurement of a mass sample and for compensating sampling errors generated by A/D converters during the measurement.

As indicated by block 152 of FIG. 6, the controller 115 initializes several variables. In particular, the controller 115 initializes variables a, d, j, and y to zero. Further, the controller 115 initializes a variable c equal to the total number of mass scans, which is 10,000 in the instant example, and the controller 115 initializes a variable x equal to the total number of A/D converters 52-55, which is four in the instant example. The controller 115 also initializes a variable z equal to the total samples to be taken by each A/D converter 52-55 for each mass scan. For example, if the resulting mass spectrum is to be defined by 4,000 sample points, then z is initialized to 1,000 (i.e., 4,000/x). The controller 115 also initializes all of the values in memory 29 to zero and initializes the address register 21 to a predefined value that points to the address where the first sample is to be stored, as depicted by block 153. In the instant example, the predefined value is equal to x, and the controller 115, therefore, initializes the address register 21 to a value of 0004.

The exemplary operation of the mass spectrometer 100 will be described hereafter assuming that each rising edge of the clock signal from clock 24 is active. In this regard, each A/D converter 52-55 only samples upon each rising edge of its respective clock signal. In other embodiments, it is possible for the falling edge or both the rising and falling edges of the clock signal to be active.

To start the first mass scan, a pulse is generated by the pulse source 17 upon a rising edge of the clock signal, as depicted by blocks 154 and 157 of FIG. 6. Then, in response to each rising edge of the clock signal, the A/D converters 52-55 generate samples, and the adder 66 sums these samples with values stored in memory 29 beginning at the address indicated by the address register 21, as indicated by blocks 163 and 165. Thus, for the first rising edge of the clock signal, the first sample from A/D converter 52 is summed with the value at address 0004, and the result is stored to address 0004. The first sample of the next A/D converter 53 is summed with the value at the next address 0005, and the result is stored to address 0005. The first samples of the next A/D converters 54 and 55 are summed with the values at the next addresses 0006 and 0007, respectively, and the results are stored to addresses 0006 and 0007, respectively.

Upon completing the summing of samples for the first rising edge of the clock cycle, the controller 115 increments y such that it has a value of y+x. Thus, just before the second rising edge of the clock signal, y is equal to four. The controller 115 compares the incremented value of y to z, as depicted by block 171. If y is less than z, then the current mass scan is not yet complete and blocks 163, 165, 168, and 171 are repeated. Once a "yes" determination is made in block 171, the current mass scan is complete, and the controller 115 initiates a new mass scan unless all of the scans have been completed.

In this regard, the controller 115 resets the value of address register 21 back to x and increments a, as depicted by block 174. The controller 115 then compares a to b, as depicted by block 176. If a is less than b, then the delay of the next mass scan, as indicated by d, is not to be adjusted. Thus, the controller 115 increments j and reinitializes y to zero, as depicted by block 179. The controller 115 also decrements the address register 21 by d, which is initially equal to a value of zero. Upon the next rising edge of the clock signal, the controller 115 initiates a pulse from the pulse source 17 after a delay of (d/x) clock cycles, as shown by blocks 180, 181, and 157. Initially, d is equal to zero, and there is no delay to the start of the mass scan associated with the pulse initiated in block 157. However, as will be described in more detail hereafter, d is periodically adjusted such that delays equal to (d/x) of a clock cycle are introduced by the controller 115 in block 181.

Once 2,500 mass scans have been performed in the current example, a is greater than or equal to b in block 176. Thus, the controller 115 adjusts the delay of the next mass scan unless all mass scans are complete. In this regard, the controller 115 increments j and reinitiates y and a to zero, as indicated by block 181. The controller 115 also compares j to c, as indicated by block 183. Once all mass scans have been completed, the value of j is equal to or greater than c, which is 10,000 in the instant example, and the process depicted by FIG. 6 ends. In such case, a complete mass spectrum is stored in memory 29.

However, if j is less than c, then all mass scans have yet to be completed. Thus, the controller 115 increments d, as indicated by block 186, and decrements the value in address register by d, as indicated by block 189. The controller 115 also sets the value of b to be equal to b+(c/x), as indicated by block 192. Note that b indicates when the next adjustment to the mass scan delay is to occur. In this regard, b is initially set to 2,500 to indicate that the first adjustment to the mass scan delay occurs after 2,500 scans. However, b is incremented to a value of 5,000 upon the first occurrence of block 192 to indicate that the second adjustment to the mass scan delay occurs after 5,000 mass scans have been performed.

Then, upon the next rising edge of the clock signal, the controller 115 waits for an amount of time equal to (d/x) of a clock cycle before initiating a pulse by the pulse source 17, as depicted by blocks 154, 197 and 199. Thus, the start of the next mass scan is effectively delay by (d/x) of a clock cycle with respect to the rising clock edge that marks the beginning of the next mass scan (i.e., the rising edge detected in block 197 for the current example). Upon the first occurrence of blocks 197 and 199, the mass scan delay is adjusted such that it is equal to one-quarter of a clock cycle. The next two occurrences of blocks 197 and 199 adjust the mass scan delay to one-half of a clock cycle and three-quarters of a clock cycle, respectively. The one-half of a clock cycle delay occurs after 5,000 mass scans, and the three-quarters of a clock cycle delay occurs after 7,5000 mass scans.

Thus, upon completion of the process depicted by FIG. 6, each summed sample (e.g., SAMPLE$_0$') stored in memory 29 and defining the resulting mass spectrum is based on equal numbers of samples from each of the A/D converters 52-55. In the instant example, each such summed sample is based on 2,500 samples from each of the A/D converters 52-55. Therefore, it is likely that the gain and offset error in at least some of the samples used to define a particular sample point (e.g., SAMPLE$_0$') will counteract the gain and offset error in other samples of the same sample point such that the overall gain and offset error for the sample point is reduced.

In the embodiments described above, the delay applied to mass scan starts is adjusted after every (1/x) mass scans. In other embodiments, the delay applied to mass scan starts may be adjusted differently. For example, the delay may be adjusted after each mass scan, and the delay cycle may be repeated after x number of mass scans. In such an example for an embodiment having four A/D converters 52-55, the first mass scan start is not delayed. The second mass scan start is delayed by one-quarter of a clock cycle, and the third mass scan start is delayed by one-half of a clock cycle. Further, the four mass scan start is delayed by three-quarters of a clock cycle. The delay cycle is then repeated. Thus, the fifth mass scan start is not delayed, the sixth mass scan start is delayed by one-quarter of a clock cycle, and so on.

In the foregoing embodiment, the algorithm used to control which of the values from memory 29 are combined with the samples from the A/D converters 52-55 is appropriately adjusted such that only corresponding samples are added together for the memory addresses (e.g., 0000-000B) defining the mass spectrum. For example, in embodiments described above in which the mass spectrum samples are defined by the values in addresses 0004-000B, the first sample from A/D converter 52 may be summed with the value at address 0004 in the first mass scan, and in the second mass scan, the first sample from A/D converter 52 may be summed with the value at address 0003. In the third and fourth mass scans, the first sample from A/D converter 52 may be summed with the values at addresses 0002 and 0001, respectively. Then, for the fifth mass scan, the first sample from A/D converter 52 may be summed with the value at address 0004. Various other algorithms and techniques for delaying the mass scan starts are possible in other embodiments.

It should be noted that techniques other than dynamically adjusting the delay of mass scan starts may be used to compensate for the gain and offset errors introduced by the A/D converters 52-55. For example, in one embodiment, the controller 115 may be configured to analyze the data in memory 29 to estimate an amount of gain and offset error introduced by each A/D converter 52-55. Then, the controller 115 may be configured to mathematically combine (e.g., add, subtract, multiply, or divide) the estimated error from summed samples stored in memory 29 in an effort to eliminate or reduce the gain and offset error from these summed samples.

For example, in one embodiment, the controller 115 may be configured to operate in the same way as the conventional controller 15 of FIG. 2 to generate a plurality of summed samples stored in memory 29. Each such sample represents a running sum that defines a point of the resulting mass spectrum. Further, as described above with reference to FIG. 2, each such running sum is based on the samples from only one of the A/D converters 52-55. As an example, the summed sample stored at address 0000 is described above in the embodiment of FIG. 2 as representing a running sum of corresponding samples from A/D converter 52.

Figure 7:
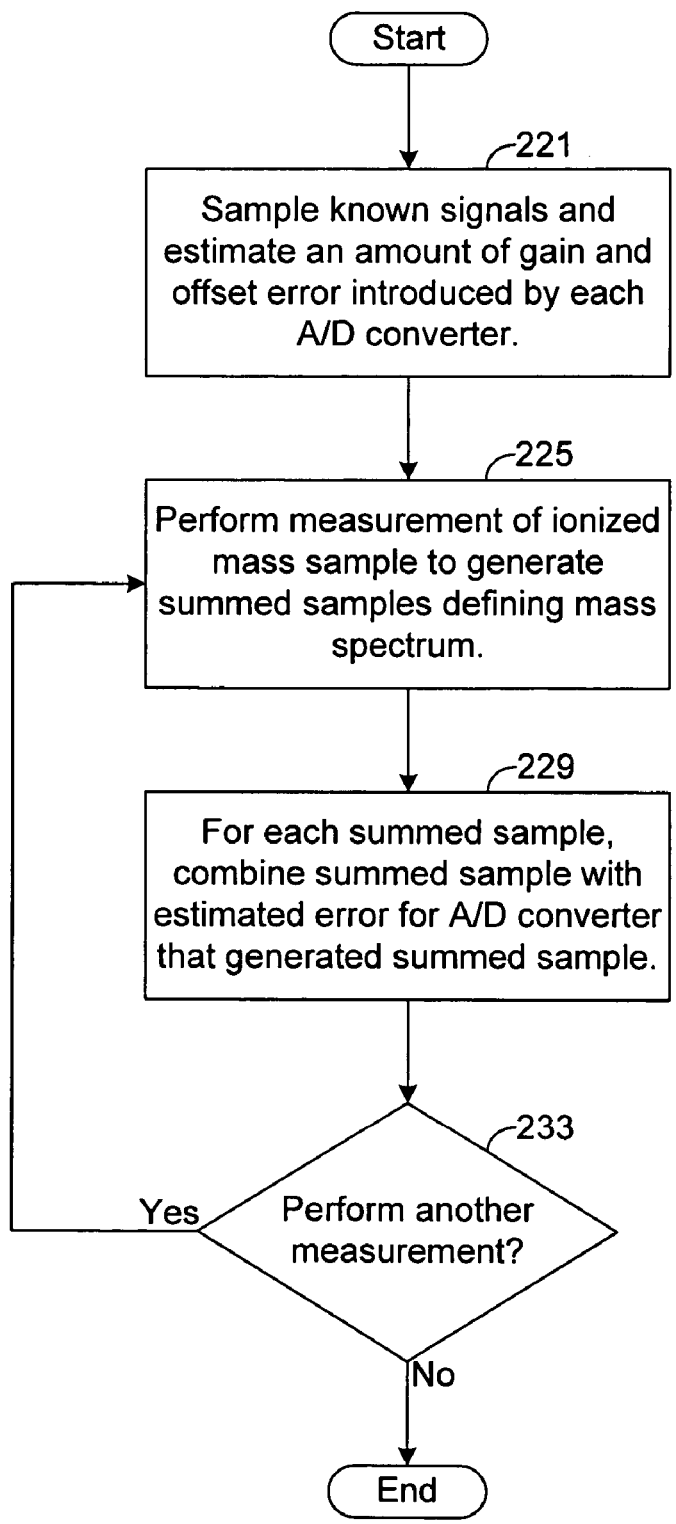
FIG. 7 is a flow chart illustrating an exemplary methodology for compensating sampling errors generated by A/D converters of a mass spectrometer.

However, before beginning a measurement of an ionized mass sample, a calibration process is performed by the spectrometer 100 to enable the controller 115 to estimate an amount of gain and offset error introduced by each A/D converter 52-55, as depicted by block 221 of FIG. 7.

During the calibration process, the A/D converters 52-55 are preferably used to sample known signals, so that, for each such signal, ideal values of the summed samples are known by the controller 115. An ideal sample value refers to a sample value that is free of the gain and offset errors introduced by the A/D converters 52-55.

As an example, a direct current (DC) signal of a specified voltage may be applied to the input of the A/D converters 52-55 by a signal generator (not shown). Thus, the value of each sample generated by the A/D converters 52-55 should ideally correspond the specified voltage. For example, if a 1 Volt DC calibration signal is applied to the analog input ports of the A/D converters 52-55, then each summed sample in memory 29 ideally would equal the digital value corresponding to 1 Volt times the number of sums performed by the adder 66 for the calibration signal. Thus, the controller 115 can analyze the samples stored in memory 29 after the calibration signal has been sampled to estimate an amount of error introduced by each A/D converter 52-55.

For instance, in the example described above with reference to FIG. 2, address 0000 stores the running sum of samples generated by the A/D converter 52. Thus, the controller 115 can compare the expected or ideal value for this address to the actual value stored in this address after sampling of the calibration signal to estimate the error introduced by the A/D converter 52. The controller 115 may similarly compare the running sums based on the samples of other A/D converters 53-55 to estimate the error introduced by these converters 53-55.

Further, multiple calibration signals of differing voltages may be similarly tested to determine the error introduced by the A/D converters 52-55 for these other signals. Moreover, based on the errors determined by the controller 115 for the multiple calibration signals, the controller 115 can estimate, for each of the A/D converters 52-55, a value, referred to as the "estimated gain error value," indicative of the estimated gain error introduced by the respective A/D converter and a value, referred to as the "estimated offset error value," indicative of the estimated offset error introduced by the respective A/D converter. These values will be used to adjust the mass spectrum samples generated by the spectrometer 100, as will be described in more detail below.

Once the calibration process is complete and the controller 115 has, therefore, determined estimated error values for each A/D converter 52-55, a measurement of a mass sample is performed, as depicted by block 225 of FIG. 7. Thus, the controller 115 controls the other components of the spectrometer 100, similar to the controller 15 of FIG. 2, such that summed samples defining the mass spectrum of the ionized mass sample are stored in memory 29. For each such summed sample, the controller 115 uses the estimated error values for the A/D converter 52-55 that generated the summed sample in order to compensate for offset and gain error introduced by such A/D converter 52-55, as depicted by block 229.

For example, as described above, the summed sample stored at address 0000 is based on corresponding samples from the A/D converter 52. Thus, the controller 115 mathematically combines (e.g., adds, subtracts, multiplies, or divides) the summed sample at address 0000 with the estimated gain error value and the estimated offset error value determined for the A/D converter 52 during the calibration process. The controller 115 may similarly adjust the other summed samples stored in memory 29 for the current measurement to similarly compensate for the gain and offset error introduced by the A/D converters 52-55 on which these samples are based.

Moreover, after adjusting the samples in block 229, the samples stored in the memory 29 define a more accurate mass spectrum for the mass sample ionized in block 225. As indicated by block 233, blocks 225 and 229 can be repeated if additional measurements of the same mass sample or different mass samples are to be performed.

In the aforedescribed embodiment, the controller 115 performs both the mass spectra measurements and the summed sample adjustments that are based on error estimates. However, it is possible for the functionality described above for controller 115 to be performed by multiple components. For example, a microprocessor (not shown) may be used to implement at least a portion of the functionality described above for the controller 115, and the memory 29 may be communicatively coupled to a host computer system (not shown) configured to receive and process the data stored in memory 29. The host computer system, separate from the microprocessor, may be configured to estimate the error introduced by the A/D converters 52-55 based on the values stored in memory 29 during the calibration process. Thereafter, the host computer system may adjust the summed samples defining a mass spectrum for an ionized mass sample based on the estimated error. In such an embodiment, the microprocessor and the host computer system separately implement portions of the functionality described above for the controller 115. Various other configurations of the controller 115 are possible in other embodiments.

I claim:
1. A system for generating mass spectra, comprising:
an ion detector;
a plurality of analog-to-digital (A/D) converters configured to sample an analog signal from the ion detector at different times, wherein the A/D converters introduce sampling errors to digital samples generated by the A/D converters;

an adder configured to sum the digital samples, wherein corresponding samples of multiple scans are summed to improve statistical accuracy; and a controller comprising at least one of firmware, software or hardware, said controller configured to compensate for the sampling errors introduced by the A/D converters, based on an actual error determined for at least one calibration signal tested by the system.

2. The system of claim 1, wherein the controller is configured to ensure that one of the digital samples summed is based on one of said digital samples generated by a different one of said plurality of A/D converters different from another one of said plurality of A/D converters that generated at least another one of the digital samples summed.

3. The system of claim 1, wherein the controller is configured to combine one of the summed digital samples with a value indicative of an expected error introduced by one of said plurality of A/D converters.

4. The system of claim 3, wherein the expected error is based on the actual error determined for at least one calibration signal tested by the system.

5. The system of claim 1, further comprising a pulse source configured to generate pulses for ionizing a mass sample.

6. The system of claim 5, wherein the pulse source and the A/D converters are synchronized by a clock signal, and wherein the controller is configured to delay at least one of the pulses with respect to the clock signal such that corresponding samples of the analog signal are generated by different ones of said plurality of A/D converters.

7. The system of claim 6, wherein the controller is configured to delay at least one of the pulses in response to a determination by the controller that a specified number of mass scans have been performed for the mass sample.

8. The system of claim 6, wherein the controller is configured to control which of the summed digital signals is combined with a digital sample from one of said plurality of A/D converters based on an amount that the at least one pulse is delayed by the controller with respect to the clock signal.

9. The system of claim 6, wherein an amount of delay introduced to the at least one pulse by the controller is based on a number of said plurality of A/D converters used to sample the analog signal.

10. A mass spectrometer, comprising:
a pulse source configured to generate pulses for ionizing a mass sample;
an ion detector configured to detect ions from the ionized mass sample;
a plurality of analog-to-digital (A/D) converters configured to sample, based on a clock signal, an analog signal from the ion detector at different times;
an adder configured to sum the digital samples, wherein corresponding samples of multiple scans are summed to improve statistical accuracy; and
a controller comprising at least one of firmware, software or hardware, said controller configured to control a timing of the pulses with respect to the clock signal such that different ones of the A/D converters generate pulses to be summed with one of the summed digital samples thereby compensating for errors introduced to the one summed digital sample by the A/D converters;
wherein the controller is configured to delay one of the pulses with respect to the clock signal in response to a determination, by the controller, that a specified number of mass scans have been performed by the mass spectrometer.

11. The mass spectrometer of claim 10, wherein the controller is configured to control which of the summed digital samples is combined with a digital sample from one of said plurality of A/D converters based on an amount that the pulse is delayed by the controller with respect to the clock signal.

12. A method for generating mass spectra, comprising:
receiving an analog signal indicative of detected ion abundance;
sampling the analog signal via a plurality of analog-to-digital (A/D) converters to provide a plurality of digital samples, the sampling introducing sampling errors to the digital samples;
summing the digital samples with corresponding samples of multiple scans;
determining a value indicative of an amount of expected error introduced by one of said plurality of A/D converters; and
compensating for the sampling errors introduced by the digital samples.

13. The method of claim 12, wherein the compensating comprises ensuring that one of the summed digital samples is based on digital samples generated by different ones of said plurality of A/D converters.

14. The method of claim 12, wherein the compensating comprises combining the value with one of the summed digital samples that is based on digital samples generated by the one A/D converter.

15. The method of claim 14, further comprising:
receiving a calibration signal; and
comparing a sample of the calibration signal to a predefined value,
wherein the determining is based on the comparing.

16. The method of claim 12, further comprising:
generating pulses;
ionizing a mass sample based on the pulses; and
synchronizing each of A/D converters with a clock signal,
wherein the compensating comprises adjusting a timing of at least one of the pulses with respect to the clock signal such that corresponding digital samples are generated by different ones of A/D converters.

17. A method for generating mass spectra, comprising:
ionizing a mass sample based on a plurality of pulses;
detecting ions from the mass sample;
transmitting an analog signal indicative of the detecting;
sampling, based on a clock signal, the analog signal via a plurality of analog-to-digital (A/D) converters;
summing digital samples of corresponding samples from multiple scans processed by the A/D converters; and
controlling a timing of the pulses with respect to the clock signal such that corresponding digital samples are generated by different ones of A/D converters thereby reducing errors in the summed digital samples, wherein said controlling includes combining one of the summed digital samples with a value indicative of an expected error introduced by one of A/D converters.

18. The method of claim 17, wherein the controlling comprises delaying at least one of the pulses with respect to the clock signal.

19. A system for generating mass spectra, comprising:
an ion detector;
a plurality of analog-to-digital (A/D) converters configured to sample an analog signal from the ion detector at different times, wherein the A/D converters introduce sampling errors to digital samples generated by the A/D converters;
an adder configured to sum the digital samples, wherein corresponding samples of multiple scans are summed to improve statistical accuracy; and
a controller configured to compensate for the sampling errors introduced by the A/D converters, wherein the controller is configured to combine one of the summed digital samples with a value indicative of an expected error introduced by one of A/D converters, and wherein the expected error is based on an actual error determined for at least one calibration signal tested by the system.

20. A system for generating mass spectra, comprising:
an ion detector;
a plurality of analog-to-digital (A/D) converters configured to sample an analog signal from the ion detector at different times, wherein said plurality of A/D converters introduce sampling errors to digital samples generated by the A/D converters;
an adder configured to sum the digital samples, wherein corresponding samples of multiple scans are summed to improve statistical accuracy;
a controller configured to compensate for the sampling errors introduced by said plurality of A/D converters; and
a pulse source configured to generate pulses for ionizing a mass sample, wherein the pulse source and said plurality of A/D converters are synchronized by a clock signal, and wherein the controller is configured to delay at least one of the pulses with respect to the clock signal such that corresponding samples of the analog signal are generated by different ones of said plurality of A/D converters.

21. A mass spectrometer, comprising:
a pulse source configured to generate pulses for ionizing a mass sample;
an ion detector configured to detect ions from the ionized mass sample;
a plurality of analog-to-digital (A/D) converters configured to sample, based on a clock signal, an analog signal from the ion detector at different times;
an adder configured to sum the digital samples, wherein corresponding samples of multiple scans are summed to improve statistical accuracy; and
a controller configured to control a timing of the pulses with respect to the clock signal such that different ones of said plurality of A/D converters generate pulses to be summed with one of the summed digital samples thereby compensating for errors introduced to the one summed digital sample by said plurality of A/D converters, wherein the controller is configured to delay one of the pulses with respect to the clock signal in response to a determination, by the controller, that a specified number of mass scans have been performed by the mass spectrometer.

22. A method for generating mass spectra, comprising:
generating pulses;
ionizing a mass sample based on the pulses;
receiving an analog signal indicative of detected ion abundance;
sampling the analog signal via a plurality of analog-to-digital (A/D) converters to provide a plurality of digital samples, the sampling introducing sampling errors to the digital samples;
synchronizing each of A/D converters with a clock signal;
summing the digital samples, wherein corresponding digital samples over multiple scans are summed; and
compensating for the sampling errors introduced by the digital samples, based on an actual error determined for at least one calibration signal tested by the system, wherein the compensating comprises adjusting a timing of at least one of the pulses with respect to the clock signal such that corresponding digital samples are generated by different ones of A/D converters.

23. A mass spectrometer, comprising:
a pulse source configured to generate pulses for ionizing a mass sample;
an ion detector configured to detect ions from the ionized mass sample;
a plurality of analog-to-digital (A/D) converters configured to sample, based on a clock signal, an analog signal from the ion detector at different times;
an adder configured to sum the digital samples, wherein corresponding samples of multiple scans are summed to improve statistical accuracy; and
a controller comprising at least one of firmware, software or hardware, said controller configured to control a timing of the pulses with respect to the clock signal such that different ones of the A/D converters generate pulses to be summed with one of the summed digital samples thereby compensating for errors introduced to the one summed digital sample by the A/D converters;
wherein the controller is configured to control which of the summed digital samples is combined with a digital sample from one of A/D converters based on an amount that the pulse is delayed by the controller with respect to the clock signal.

24. A method for generating mass spectra, comprising:
receiving an analog signal indicative of detected ion abundance;
sampling the analog signal via a plurality of analog-to-digital (A/D) converters to provide a plurality of digital samples, the sampling introducing sampling errors to the digital samples;
summing the digital samples wherein corresponding digital samples over multiple scans are summed;
compensating for the sampling errors introduced by the digital samples;
generating pulses;
ionizing a mass sample based on the pulses; and
synchronizing each of A/D converters with a clock signal, wherein the compensating comprises adjusting a timing of at least one of the pulses with respect to the clock signal such that corresponding digital samples are generated by different ones of the A/D converters.

* * * * *

UNITED STATES PATENT AND TRADEMARK OFFICE
CERTIFICATE OF CORRECTION

| | |
|---|---|
| PATENT NO. | : 7,450,042 B2 |
| APPLICATION NO. | : 11/412563 |
| DATED | : November 11, 2008 |
| INVENTOR(S) | : Hidalgo |

It is certified that error appears in the above-identified patent and that said Letters Patent is hereby corrected as shown below:

In column 13, line 15, in Claim 2, after "said" delete "plurality of".

In column 13, line 16, in Claim 2, after "said" delete "plurality of".

In column 13, line 21, in Claim 3, before "A/D" delete "plurality of".

In column 13, line 33, in Claim 6, after "said" delete "plurality of".

In column 13, line 40, in Claim 8, after "said" delete "plurality of".

In column 13, line 45, in Claim 9, after "said" delete "plurality of".

In column 14, line 7, in Claim 11, before "A/D" delete "plurality of".

In column 14, line 19, in Claim 12, after "said" delete "plurality of".

In column 14, line 26, in Claim 13, before "A/D" delete "plurality of".

In column 14, line 40, in Claim 16, delete "A/D" and insert -- the A/D --, therefor.

In column 14, line 44, in Claim 16, delete "A/D" and insert -- the A/D --, therefor.

In column 14, line 56, in Claim 17, delete "A/D" and insert -- the A/D --, therefor.

In column 14, line 60, in Claim 17, delete "A/D" and insert -- the A/D --, therefor.

In column 15, line 11, in Claim 19, delete "A/D" and insert -- the A/D --, therefor.

In column 15, line 18, in Claim 20, after "said" delete "plurality of".

In column 15, line 25, in Claim 20, after "said" delete "plurality of".

In column 15, line 33, in Claim 20, after "said" delete "plurality of".

In column 15, line 48, in Claim 21, after "said" delete "plurality of".

UNITED STATES PATENT AND TRADEMARK OFFICE
CERTIFICATE OF CORRECTION

PATENT NO.         : 7,450,042 B2
APPLICATION NO.    : 11/412563
DATED              : November 11, 2008
INVENTOR(S)        : Hidalgo It is certified that error appears in the above-identified patent and that said Letters Patent is hereby corrected as shown below:

In column 15, line 51, in Claim 21, after "said" delete "plurality of".

In column 16, line 7, in Claim 22, delete "A/D" and insert -- the A/D --, therefor.

In column 16, line 16, in Claim 22, delete "A/D" and insert -- the A/D --, therefor.

In column 16, line 37, in Claim 23, delete "A/D" and insert -- the A/D --, therefor.

In column 16, line 53, in Claim 24, delete "A/D" and insert -- the A/D --, therefor.

Signed and Sealed this

Twenty-first Day of July, 2009

JOHN DOLL
*Acting Director of the United States Patent and Trademark Office*